(12) United States Patent
Pasadyn et al.

(10) Patent No.: US 6,788,988 B1
(45) Date of Patent: Sep. 7, 2004

(54) METHOD AND APPARATUS USING INTEGRATED METROLOGY DATA FOR PRE-PROCESS AND POST-PROCESS CONTROL

(75) Inventors: Alexander J. Pasadyn, Austin, TX (US); Christopher A. Bode, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/023,098

(22) Filed: Dec. 17, 2001

(51) Int. Cl.[7] ................................................. G06F 19/00

(52) U.S. Cl. ....................... 700/110; 700/109

(58) Field of Search ................................ 700/108, 112, 700/121, 2, 4, 9, 20, 96, 109, 110; 716/4, 19; 438/5, 14

(56) References Cited

U.S. PATENT DOCUMENTS 6,298,470 B1 * 10/2001 Breiner et al. ................. 716/4

* cited by examiner

Primary Examiner—Albert W. Paladini
Assistant Examiner—Carlos R. Ortiz
(74) Attorney, Agent, or Firm—Williams, Morgan & Amerson, P.C.

(57) ABSTRACT

A method and an apparatus for acquiring pre-process and post-process integrated metrology data. A lot of semiconductor wafers is provided. A pre-process integrated metrology data acquisition from a first semiconductor wafer within the lot of semiconductor wafers is performed. A process operation on the first semiconductor wafer is performed at least partially during the process of acquiring pre-process metrology data from a second semiconductor wafer within the lot of semiconductor wafers. Post-process integrated metrology data is acquired from the first semiconductor wafer in response to processing of the first semiconductor wafer. The pre-process and the post-process metrology data is analyzed for evaluation of the process operation performed on the first semiconductor wafer.

34 Claims, 8 Drawing Sheets

METHOD AND APPARATUS USING INTEGRATED METROLOGY DATA FOR PRE-PROCESS AND POST-PROCESS CONTROL

BACKGROUND OF THE INVENTION

1. Field of the Invention

This invention relates generally to semiconductor manufacturing, and, more particularly, to a method and apparatus for acquiring metrology data using an integrated metrology tool for pre-process and post-process control.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot. For example, a process layer composed of a variety of materials may be formed above a wafer. Thereafter, a patterned layer of photoresist may be formed above the process layer using known photolithography techniques. Typically, an etch process is then performed on the process layer using the patterned layer of photoresist as a mask. This etching process results in formation of various features or objects in the process layer. Such features may be used for a gate electrode structure for transistors. Typically, shallow trench isolation (STI) structures formed on the semiconductor wafers are filled by forming silicon dioxide using tetraethoxysilane (TEOS), over the wafer and in the STI structures. The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

FIG. 1 illustrates a typical semiconductor wafer 105. The wafer 105 typically includes a plurality of individual semiconductor die 103 arranged in a grid 150. Photolithography steps are typically performed by a stepper on approximately one to four die locations at a time, depending on the specific photomask employed. Photolithography steps are generally performed to form patterned layers of photoresist above one or more process layers that are to be patterned. The patterned photoresist layer can be used as a mask during etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features, such as a polysilicon line, or opening-type features, that are to be replicated in an underlying process layer.

In some cases, pre-process manufacturing data relating to semiconductor wafers 105 that are about to be processed is acquired. For example, before a chemical/mechanical polishing (CMP) operation is performed on a semiconductor wafer, generally a pre-polish, or pre-process manufacturing data acquisition step is performed. In many cases, the pre-process data is used to perform comparisons with post-process data to determine whether a particular process was accurately performed on a semiconductor wafer 105. Similarly, after performing certain types of manufacturing processes, such as a deposition process, post-manufacturing data or post-process data (e.g., post-deposition data), is acquired. In these cases, post-process data is useful in determining whether a particular manufacturing process has been performed within predetermined specifications.

Turning now to FIG. 2, a set of semiconductor wafers 105 to be processed is generally acquired by a manufacturing system (block 210). Many times, the manufacturing system performs an offline metrology data acquisition process (block 220) to collect pre-process data before performing certain types of processes, such as CMP processes. In some cases, only after offline metrology data acquisition is performed, will the manufacturing system perform a process step on the semiconductor wafers (block 230). In many cases, the manufacturing system then acquires offline metrology data subsequent to the processing (i.e., acquiring post-process data, such as post-deposition manufacturing data) (block 240).

Generally, the order and manner in which current manufacturing systems acquire pre-process and post-process data can become time consuming and cause inefficiencies and/or delays during semiconductor manufacturing. For example, acquiring offline metrology data and analyzing the offline metrology data to determine if a particular process has been implemented under acceptable margins of tolerance can delay a manufacturing process flow. Delays suffered during a manufacturing process flow may result in increased manufacturing expenses. Furthermore, the prior art routine described by FIG. 2 sometimes causes the manufacturing system to acquire metrology data from different metrology tools for the same set of semiconductor wafers. This can cause calibration errors partially because metrology tools may acquire slightly different data from one process to another. Calibrations of different metrology tools may vary, causing inaccuracies in the analysis of the acquired metrology data. This can cause inaccuracies during metrology data analysis, resulting in additional errors in the manufacturing of semiconductor wafers 105.

The present invention is directed to overcoming, or at least reducing the effects of, one or more of the problems set forth above.

SUMMARY OF THE INVENTION

In one aspect of the present invention, a method is provided for acquiring pre-process and post-process integrated metrology data. A lot of semiconductor wafers is provided. A pre-process integrated metrology data acquisition from a first semiconductor wafer within the lot of semiconductor wafers is performed. A process operation on the first semiconductor wafer is performed at least partially during the process of acquiring pre-process metrology data from a second semiconductor wafer within the lot of semiconductor wafers. Post-process integrated metrology data is acquired from the first semiconductor wafer in response to processing of the first semiconductor wafer. The pre-process and the post-process metrology data is analyzed for evaluation of the process operation performed on the first semiconductor wafer.

In another aspect of the present invention, a system is provided for acquiring pre-process and post-process integrated metrology data. The system of the present invention comprises: a process controller to perform an integrated metrology data acquisition operation comprising: performing a pre-process integrated metrology data acquisition from a first semiconductor wafer within a lot of semiconductor wafers; performing a process operation on the first semiconductor wafer at least partially during the process of acquiring pre-process metrology data from a second semiconductor wafer within the lot of semiconductor wafers; acquiring post-process integrated metrology data from the first semiconductor wafer in response to processing of the first semiconductor wafer; analyzing the pre-process and the post-process metrology data for evaluation of the process operation performed on the first semiconductor wafer; performing a feed-forward adjustment for a subsequent process operation performed on the first semiconductor wafer based upon the evaluation; and performing a feedback adjustment for a subsequent process operation performed on the second semiconductor wafer based upon the evaluation; an integrated metrology data storage unit operatively coupled to the process controller, the integrated metrology data storage unit to receive and store the pre-process and post-process integrated metrology data. The system of the present invention also comprises: a processing tool operatively coupled to the process controller, the processing tool to perform the process operation and acquire the pre-process and post-process integrated metrology data, the processing tool comprising: a process chamber for performing the process operation; and an integrated metrology tool for acquiring the pre-process and post-process integrated metrology data.

BRIEF DESCRIPTION OF THE DRAWINGS

The invention may be understood by reference to the following description taken in conjunction with the accompanying drawings, in which like reference numerals identify like elements, and in which.

Figure 1:
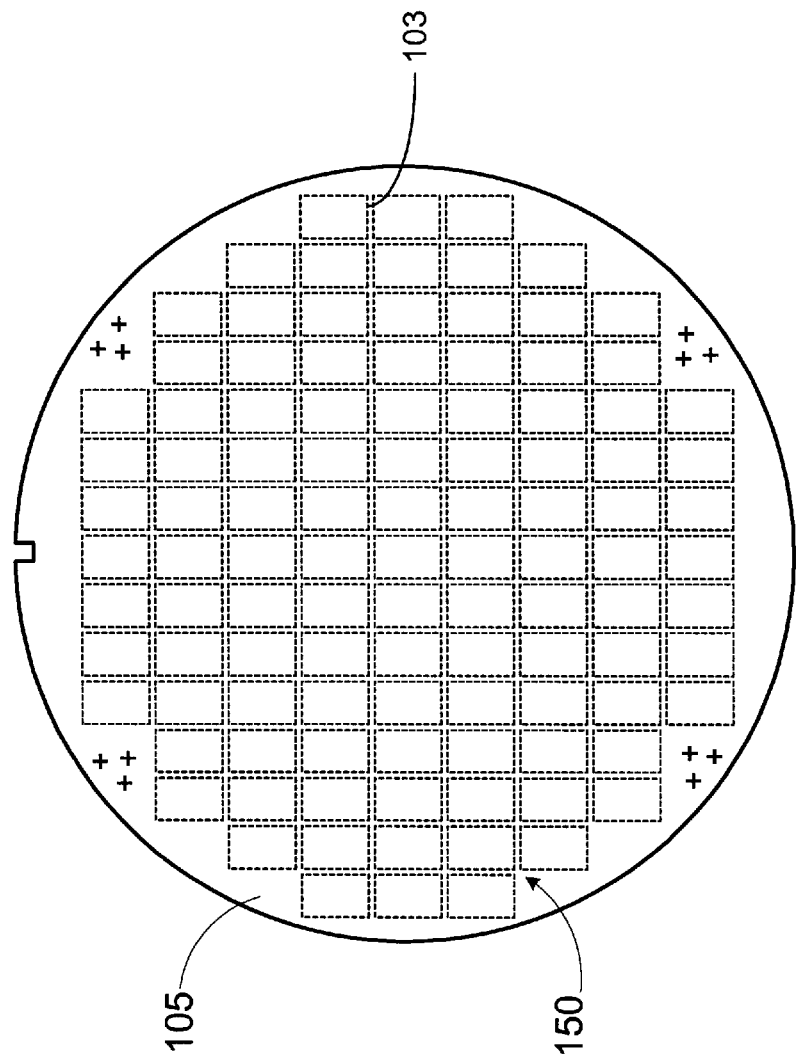
FIG. 1 is a simplified diagram of a prior art semiconductor wafer being processed.
Figure 2:
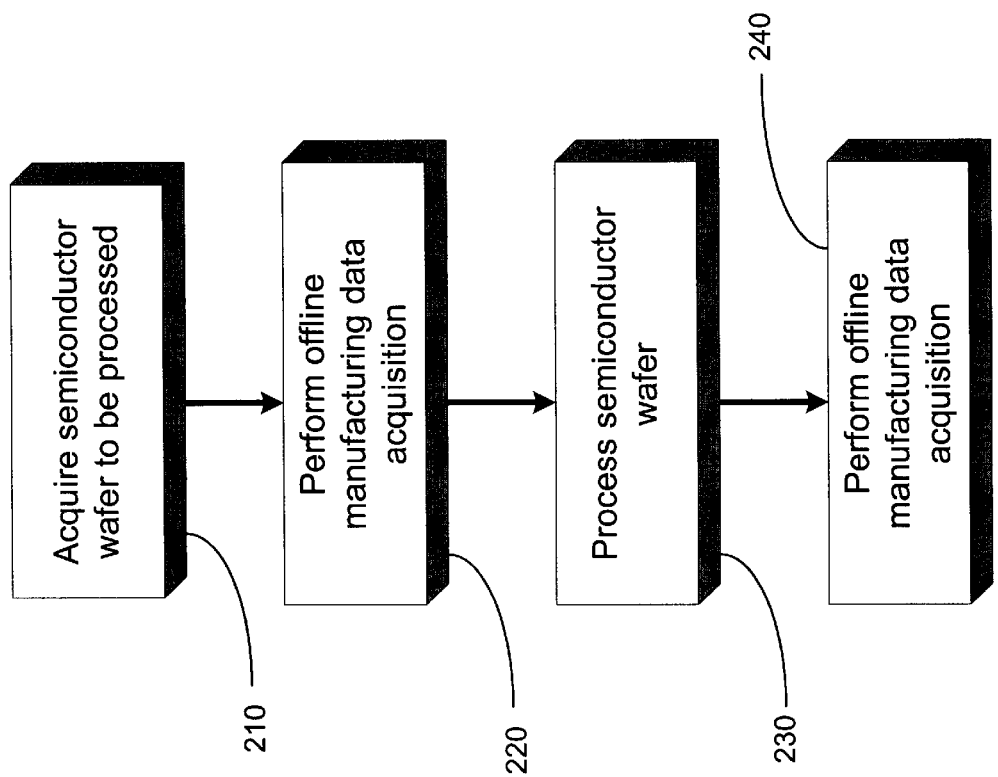
FIG. 2 illustrates a simplified flowchart depiction of a prior art process flow during manufacturing of semiconductor wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. Often, at least a portion of a manufacturing lot of semiconductor wafers is examined by offline metrology tools after a process operation is performed in the semiconductor wafers to acquire post-process metrology data. Errors discovered during this examination can be used to generate modifications for subsequent processes performed on the semiconductor wafers. These modifications to the new process are generally used to reduce the effects of errors discovered in the original process. Many times, offline metrology data results become available too late for performing such downstream modifications or to perform comparisons with pre-process data to evaluate the accuracy of a process in a timely manner.

In a general sense, embodiments of the present invention provide for performing inline metrology data acquisition using an integrated metrology tool for more efficient and meaningful evaluation of process operations performed on a semiconductor wafer 105. Embodiments of the present invention allow for more efficient acquisition of pre-process and post-process metrology data acquired using integrated metrology tools. Embodiments of the present invention provide for acquiring pre-processing metrology data of semiconductor wafers 105 using an integrated metrology tool while processing other semiconductor wafers 105 of the same manufacturing lot.

In one embodiment, offline metrology data includes metrology data that is not part of the production flow during processing of semiconductor wafers 105. For example, offline metrology data may refer to electrical test results of the processed semiconductor wafers 105, yield of the processed semiconductor wafers 105, and the like. Offline metrology data can be used to perform feedback adjustments to subsequent processes performed on semiconductor wafers 105 from a different lot, e.g., lot-to-lot feedback process control.

In one embodiment, inline metrology data includes metrology data acquired by a standalone metrology tool yielding data associated with a particular processing operation or tied to a particular process. For example, inline metrology data may include data relating to film thickness, line-width of certain features on processed semiconductor wafers 105, overlay measurements resulting from photolithography measurements, and the like. An integrated metrology tool, which is described in greater detail below, may be used to acquire integrated metrology data. Integrated metrology may refer to metrology data acquired by metrology tools that operate within a sequence of wafer movement during the processing of the wafers. In one embodiment, integrated metrology data includes inline metrology data that is acquired by a metrology tool integrated into a processing tool, which is described in greater detail below. Inline metrology data acquired by the integrated metrology tool may be used to perform feedback adjustments to processing of semiconductor wafers 105 within a particular lot, e.g., wafer-to-wafer feedback process control.

Figure 3:
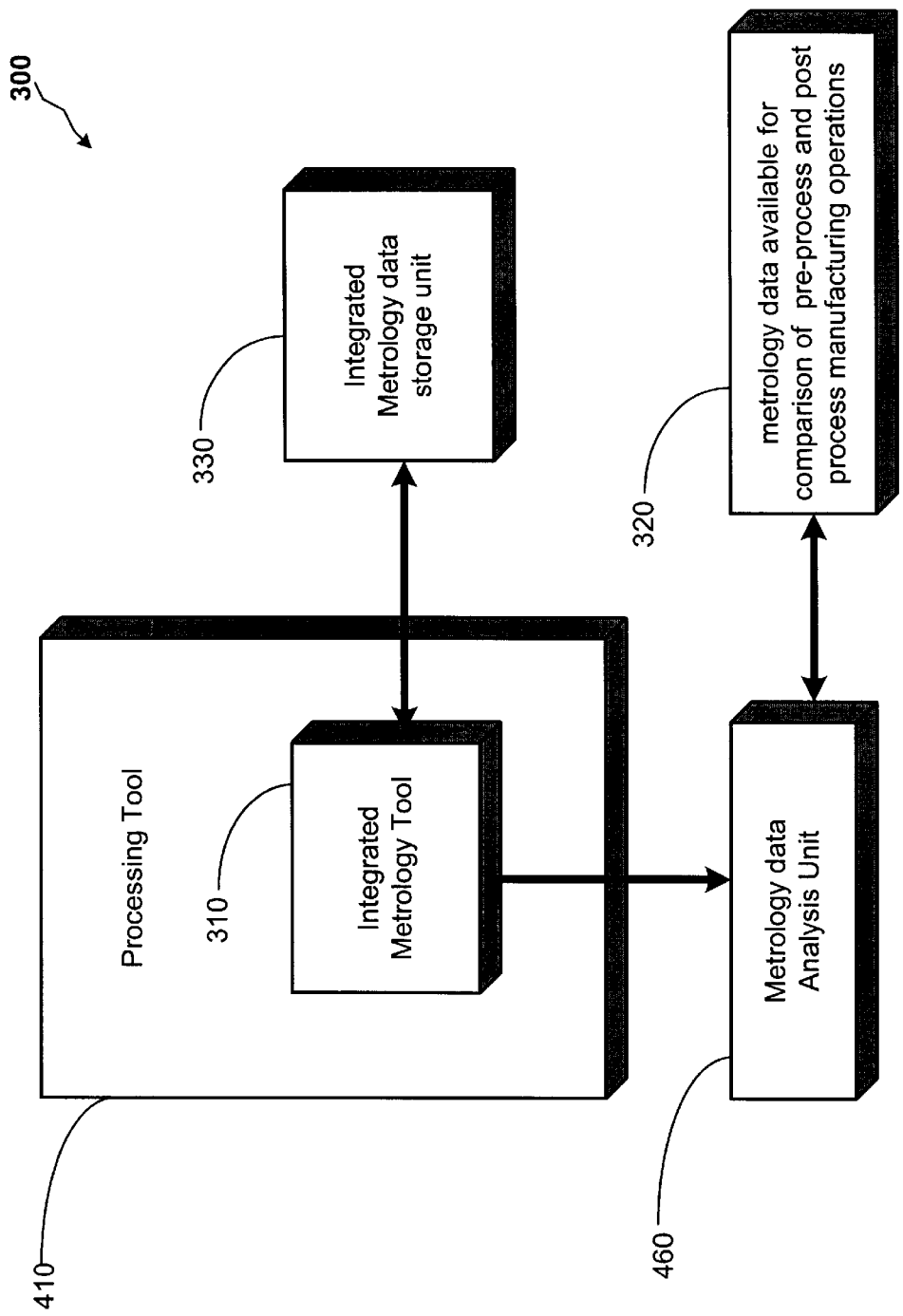
FIG. 3 is a block diagram representation of a system in accordance with one illustrative embodiment of the present invention.

Turning now to FIG. 3, a system 300 capable of performing the methods taught by one embodiment of the present invention, is illustrated. In one embodiment, a processing tool 410 comprises an integrated metrology tool 310. In one embodiment, the integrated metrology tool 310 may be incorporated into the flow of semiconductor wafers 105 through a processing tool 410. In other words, the semiconductor wafers 105 generally pass through the integrated metrology tool 310, as the wafers 105 would pass through other processing stations (not shown) on the processing tool 410. The integrated metrology tool 310 is capable of acquiring inline metrology data (e.g., acquiring metrology data of semiconductor wafers 105 while they are still under the control of the processing tool 410). Acquiring inline metrology data is generally less intrusive to a manufacturing process flow, as compared to acquiring offline metrology data, which requires the use of an external metrology data tool. Furthermore, the integrated metrology tool 310 is also capable of acquiring pre-process metrology data from semiconductor wafers 105.

The integrated metrology tool 310 acquires pre-process and/or post-process metrology data in an inline fashion. In other words, prior to, during, or immediately following a manufacturing process, the integrated metrology tool 310 acquires metrology data from the processed semiconductor wafers 105. In one embodiment, the integrated metrology tool 310 is placed within a chamber (not shown) associated with the processing tool 410. In one embodiment, the integrated metrology tool 310 sends metrology data (real-time or near real-time time data) to an integrated metrology data storage unit 330. The integrated metrology data storage unit 330 stores the metrology data such that it can be retrieved by the system 300 for further analysis during or after a manufacturing process cycle. Pre-process and post-process metrology data acquired by the integrated metrology tool 310 is stored in the integrated metrology data storage unit 330. In embodiment, using the same metrology tool to acquire pre-process and post-process may lead to improved precision and accuracy in the measurement. The reason for the improved precision and accuracy may include the fact that tool-dependent measurement bias may be reduced when one metrology tool is used to acquire both pre-process and post-process metrology data.

Data from the integrated metrology tool 310 may also be sent to the metrology data analysis unit 460. The metrology data analysis unit 460 is capable of correlating particular metrology data to corresponding semiconductor wafers 105. In one embodiment, metrology data analysis unit 460 also sends metrology data to the integrated metrology data storage unit 330 for storage. The real-time, or near real-time, metrology data stored in the metrology data storage unit 330 provides the system 300 access to immediate manufacturing data that can be used to further correct or enhance the accuracy of one or more processes performed on the semiconductor wafers 105. Pre-process and post-process data stored in the integrated metrology data storage unit 330 may be used by the system 300 to perform comparisons between the pre-process and post-process data to evaluate the accuracy of the processes performed on semiconductor wafers 105. Based upon the evaluation, modifications to subsequent processing of semiconductor wafers 105 may be performed by the system 300.

Figure 4:
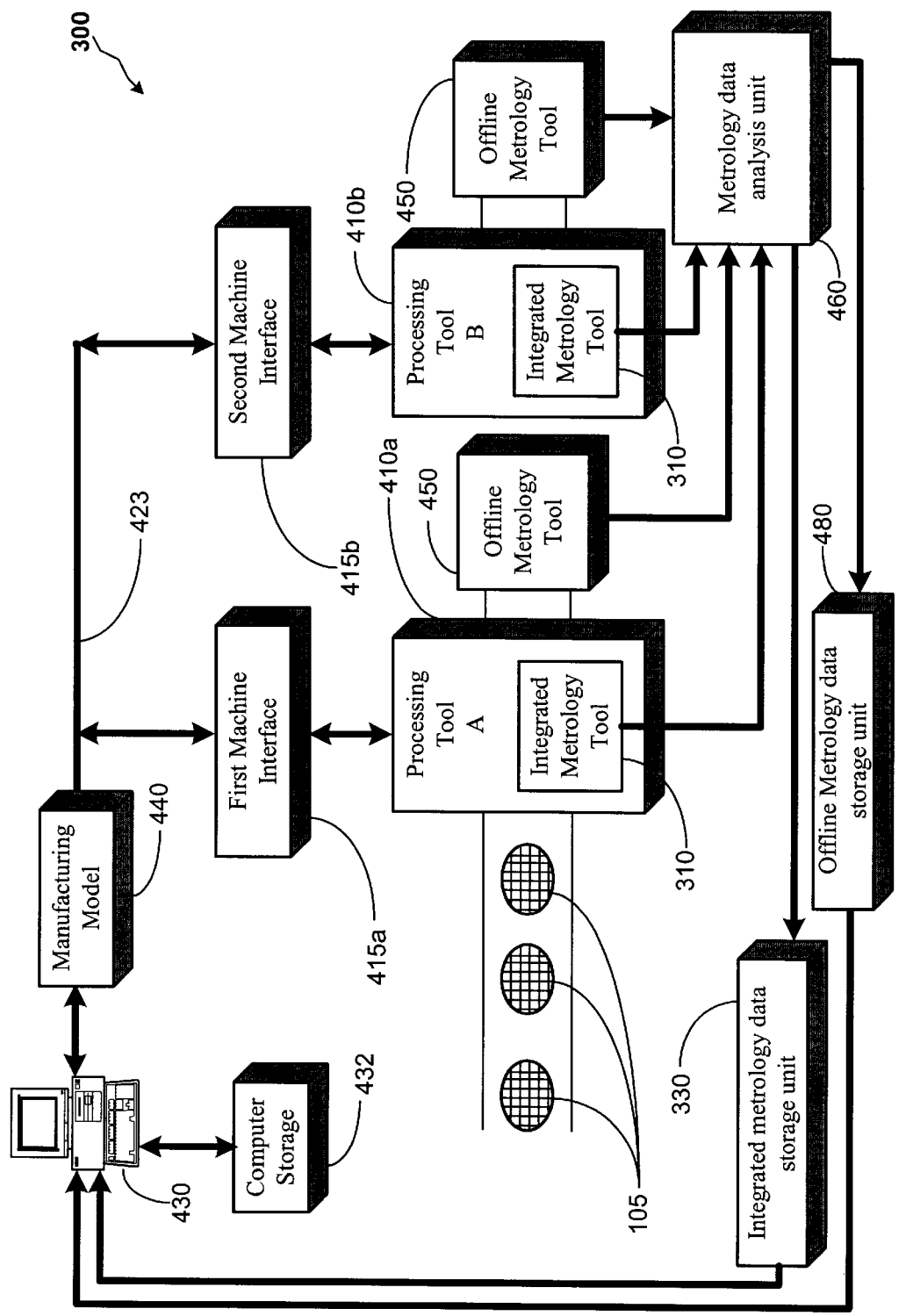
FIG. 4 illustrates a more detailed block diagram representation of the system shown in FIG. 3, in accordance with one illustrative embodiment of the present invention.

Turning now to FIG. 4, a more detailed block diagram of the system 300 in accordance with one embodiment of the present invention is illustrated. In one embodiment, semiconductor wafers 105, are processed on processing tools 410a, 410b using a plurality of control input signals, or manufacturing parameters, provided via a line or network 423. In one embodiment, control input signals, or manufacturing parameters, on the line 423 are sent to the processing tools 410a, 410b from a computer system 430 via machine interfaces 415a, 415b. In one embodiment, the first and second machine interfaces 415a, 415b are located outside the processing tools 410a, 410b. In an alternative embodiment, the first and second machine interfaces 415a, 415b are located within the processing tools 410a, 410b. The semiconductor wafers 105 are provided to and carried from a plurality of processing tools 410. In one embodiment, semiconductor wafers 105 may be provided to a processing tool 410 manually. In an alternative embodiment, semiconductor wafers 105 may be provided to a processing tool 410 in an automatic fashion (e.g., robotic movement of semiconductor wafer 105). In one embodiment, a plurality of semiconductor wafers 105 are transported in lots (e.g., stacked in cassettes) to the processing tools 410.

In one embodiment, the computer system 430 sends control input signals, or manufacturing parameters, on the line 423 to the first and second machine interfaces 415a, 415b. The computer system 430 is capable of controlling processing operations. In one embodiment, the computer system 430 is a process controller. The computer system 430 is coupled to a computer storage unit 432 that comprises memory that may comprise a plurality of software programs and data sets. The computer system 430 may contain one or more processors (not shown) that are capable of performing the operations described herein. The computer system 430 employs a manufacturing model 440 to generate control input signals on the line 423. In one embodiment, the manufacturing model 440 contains a manufacturing recipe that determines a plurality of control input parameters that are sent on the line 423 to the processing tools 410a, 410b.

In one embodiment, the manufacturing model 440 defines a process script and input control that implement a particular manufacturing process. The control input signals (or control input parameters) on the line 423 that are intended for processing tool A 410a are received and processed by the first machine interface 415a. The control input signals on the line 423 that are intended for processing tool B 410b are received and processed by the second machine interface 415b. Examples of the processing tools 410a, 410b used in semiconductor manufacturing processes are steppers, etch process tools, deposition tools, and the like.

One or more of the semiconductor wafers 105 that are processed by the processing tools 410a, 410b can also be sent to an offline metrology tool 450 for acquisition of metrology data. The offline metrology tool 450 can be a scatterometry data acquisition tool, an overlay-error measurement tool, a critical dimension measurement tool, and the like. In one embodiment, one or more processed semiconductor wafers 105 are examined by an offline metrology tool 450. Furthermore, metrology data may also be collected by the integrated metrology tool 310 within the processing tools 410a and 410b. Data from the integrated metrology tool 310 and the offline metrology tool 450 may be collected by the metrology data analysis unit 460. In one embodiment, pre-process and/or post-process data may be acquired by the integrated metrology tool 310. The metrology data can be directed to a variety of physical or electrical characteristics of the devices formed on the wafers 105. For example metrology data may be obtained as to line width measurements, depth of trenches, sidewall angles, thickness, resistance, and the like. As described above, the metrology data analysis unit 460 organizes, analyses, and correlates metrology data acquired by the offline metrology tool 450 to particular semiconductor wafers 105 that were examined.

The metrology data analysis unit 460 collects metrology data from the integrated metrology tool 310 and the offline metrology tool 450. The data collected by the metrology data analysis unit 460 includes pre-process metrology data as well as post-process metrology data. The metrology data analysis unit 460 sends pre-process and post-process metrology data acquired by the integrated metrology tool 310 to the integrated metrology data storage unit 330 for data storage. The offline metrology data is stored in the offline metrology data storage unit 480. In one embodiment, the integrated metrology data storage unit 330 and the offline metrology data storage unit 480 may be standalone units or they may be memory locations integrated into the computer system 430 and/or the computer storage 432. The pre-process metrology data and the offline metrology data are then made available for the computer system 430 for further analysis.

The system 300 is capable of acquiring pre-process metrology data as well as post-process metrology data in an efficient manner without significant interruption to the process flow. In other words, the system 300 is able to acquire pre-process metrology data from a plurality of wafers 105 using the integrated metrology tool 310 and simultaneously process a semiconductor wafer 105 from the same manufacturing lot, thereby increasing the amount of metrology data collected without interrupting the process flow of the manufacturing operation. In other words, more metrology data can be collected using embodiments of the present invention because using the integrated metrology tool 310, more efficient routing of semiconductor wafer 105 (through processing and metrology data acquisition) is possible, resulting in increased amount of metrology data. The computer system 430 can then compare pre-process and post-process data acquired by the integrated metrology tool 310 and/or the offline metrology tool 450 to evaluate a particular process performed on a semiconductor wafer 105. In response to the evaluation, the computer system 430 may modify one or more control input parameters that drive other processing operations.

Figure 5:
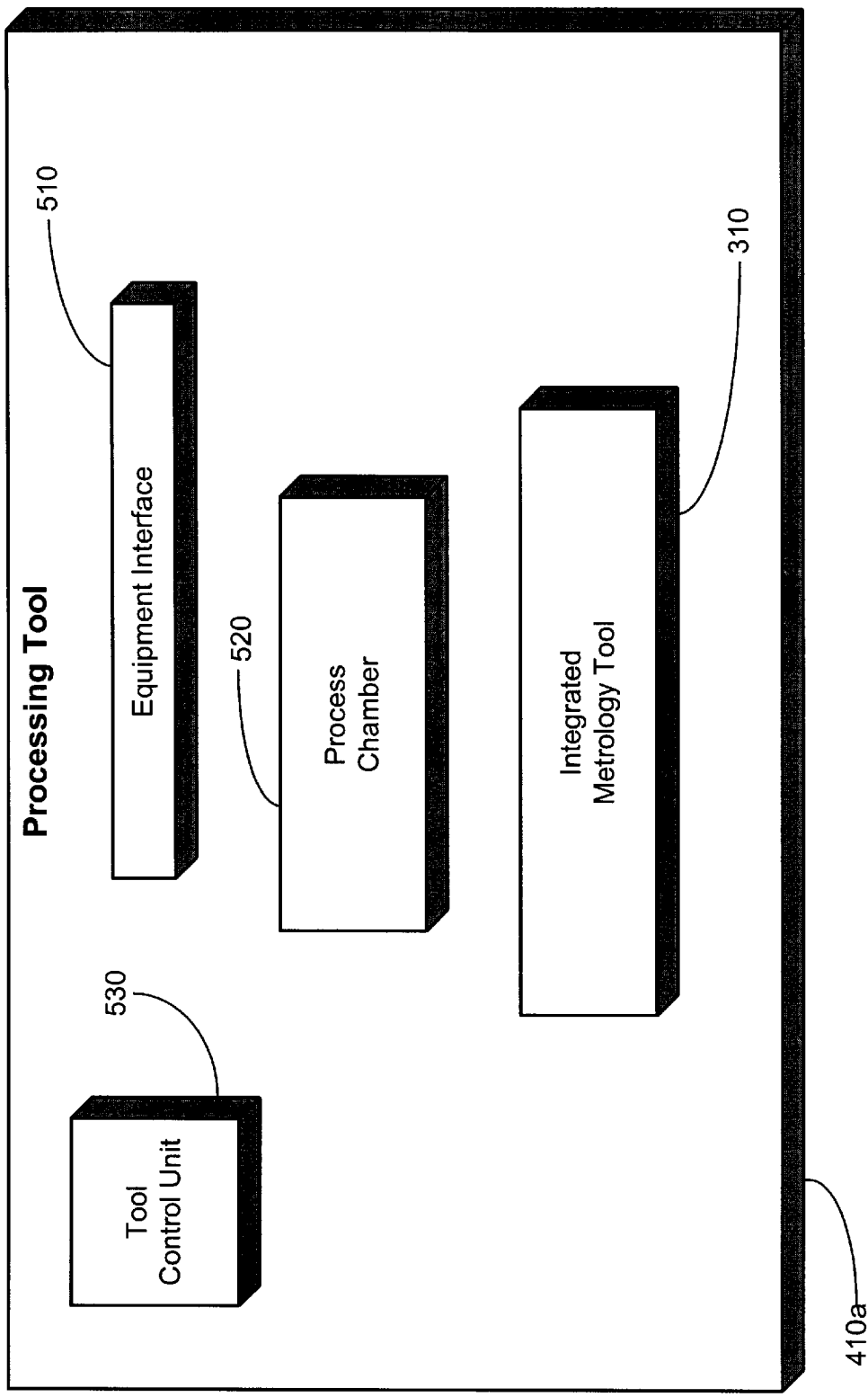
FIG. 5 illustrates a more detailed block diagram representation of a processing tool shown in FIGS. 3 and 4, in accordance with one illustrative embodiment of the present invention.

Turning now to FIG. 5, a more detailed block diagram illustration of an illustrative processing tool, such as processing tool 410a is shown. In one embodiment, the processing tool 410a comprises an equipment interface 510, a process chamber 520, a tool control unit 530, and an integrated metrology tool 310. The processing tool 410a receives control parameter data via the equipment interface 510. Data from the processing tool 410a is also sent to other portions of the system 300, such as the computer system 430, via the equipment interface 510. The tool control unit 530 controls processing operations of semiconductor wafers 105 in the process chamber 520. The tool control unit 530 receives control parameter data and/or instructions from the computer system 430 via the equipment interface 510 and executes the appropriate action.

The integrated metrology tool 310 acquires metrology data of the semiconductor wafers 105 that were processed in the process chamber 520. The integrated metrology tool 310 is also capable of acquiring pre-process metrology data from one semiconductor wafer 105 while performing a process operation on another wafer 105. The tool control unit 530 also controls the integrated metrology tool 310. In accordance with embodiments of the present invention, the integrated metrology tool 310 acquires real-time or near real-time metrology data from semiconductor wafers 105 processed (post-process metrology data), and makes such data available to the system 300 for more efficient and quick analysis of metrology data. Furthermore, pre-process and post-process metrology data acquisition performed by the integrated metrology tool 310 may be supplemented by data acquisition performed by the offline metrology tool 450.

Figure 6:
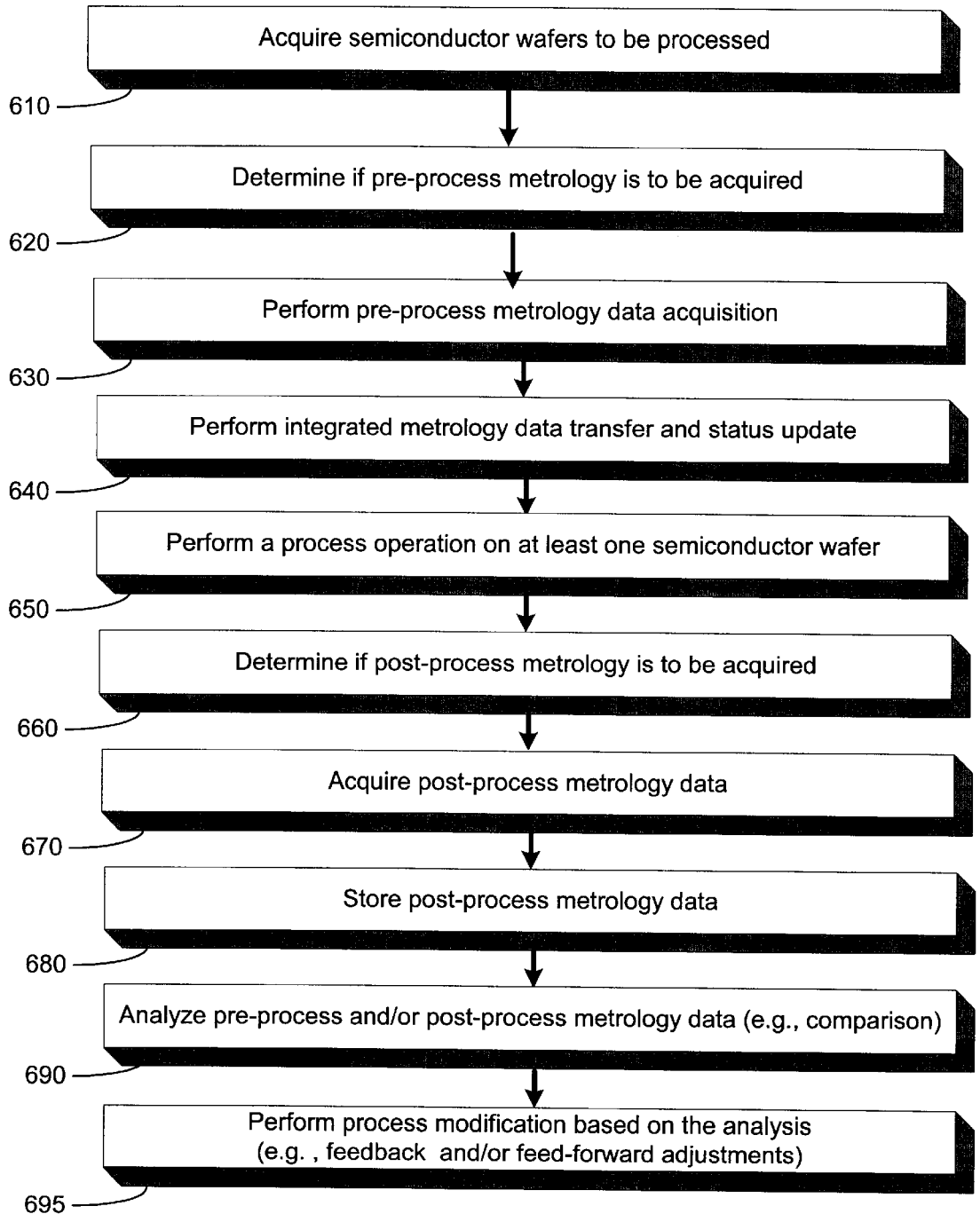
FIG. 6 illustrates a flowchart depiction of a method in accordance with one illustrative embodiment of the present invention.

Turning now to FIG. 6, a flowchart depiction of one embodiment of the present invention in accordance with one embodiment of the present invention is illustrated. The system 300 acquires semiconductor wafers 105 for processing (block 610). The tool control unit 530 receives instructions and control parameters from the computer system 430 and the manufacturing model 440 via the equipment interface 510. Once the semiconductor wafers 105 to be processed are acquired, the system 300 determines whether pre-process metrology data is desired for the particular process to be executed (block 620). In one embodiment, the tool control unit 530 can make such a determination based upon the control parameter inputs received via the equipment interface 510. For example, if a chemical/mechanical polishing process is to be executed, the tool control unit 530 may determine that pre-process metrology data (e.g., pre-polish data), such as layer thickness, surface topography, etc., should be acquired. In such a case, the system 300 performs a pre-process metrology data acquisition on the semiconductor wafers 105 to be processed (block 630). In one embodiment, pre-process metrology data is acquired using the integrated metrology tool 310, but may also be acquired by the offline metrology tool 450.

Once the integrated metrology data is acquired by the system 300, the system 300 performs an integrated metrology data and status update (block 640). In other words, the newly acquired integrated metrology data (e.g., pre-process and/or post-process metrology data acquired by the integrated metrology tool 310) is added to the integrated metrology data storage unit 330. The processing tool 410 updates the system 300 regarding the availability of the newly acquired inline metrology tool. Accordingly, the system 300 can recognize when pre-process and/or post-process metrology data is available. A more detailed description of performing integrated metrology data transfer and status update is provided in FIG. 7 and by its accompanying description below.

Once pre-process metrology data is acquired, the system 300 processes the semiconductor wafers 105 (block 650). The semiconductor wafers 105, in one embodiment, are processed by sending the semiconductor wafers 105 to the process chamber 520 from the integrated metrology tool 310 within the processing tool 410. The semiconductor wafers 105 are processed in the process chamber 520. In one embodiment, while one semiconductor wafer 105 is being processed in the process chamber 520, another semiconductor wafer 105 is in a queue waiting to be processed. The wafer 105 waiting in the queue may simultaneously be sent to the integrated metrology tool 310 for pre-process metrology data acquisition.

Once the semiconductor wafers 105 are processed by the processing tool 410, a determination by the system 300 is made whether post-process metrology data is desired (block 660). In one embodiment the tool control unit 530 determines whether post-processing metrology data is desired based upon the particular process that was executed in the process chamber 520. For example, after a deposition process is performed on a semiconductor wafer 105, it is desirable to acquire post-processing (e.g., post-deposition data) metrology data for analysis of the effectiveness and accuracy of the process previously performed. The post-process metrology data, in one embodiment, is performed by sending the semiconductor wafers 105 in the process chamber 520 to the integrated metrology tool 310 for metrology data acquisition.

Figure 8:
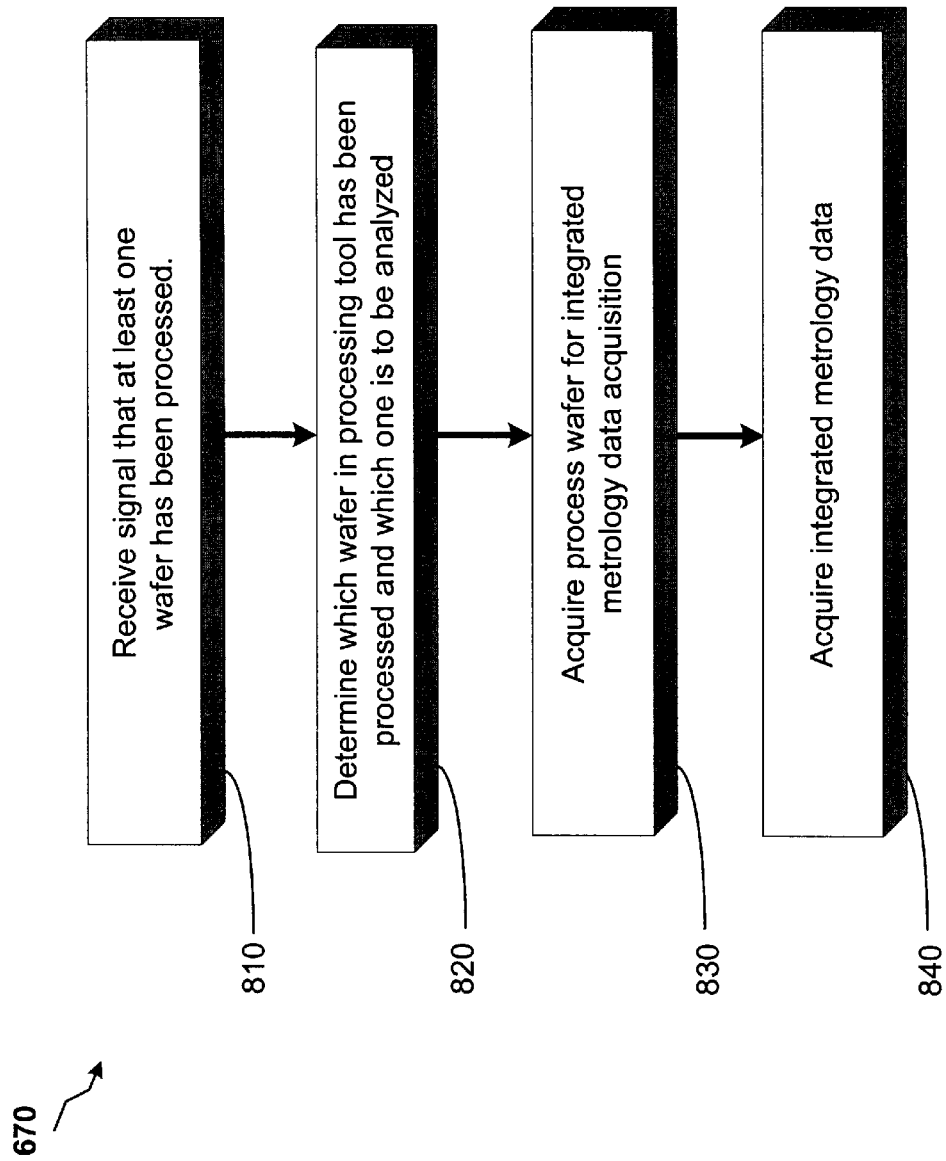
FIG. 8 illustrates a flowchart depiction of a method of acquiring post-process inline metrology data, as indicated in FIG. 6, in accordance with one illustrative embodiment of the present invention.

In an alternative embodiment, the post-process metrology data is acquired in an offline fashion, using the offline metrology tool 450. A more detailed description of the process of acquiring post-process metrology data (block 670) is illustrated in FIG. 8 and provided in the accompanying description below. Once post-processing metrology data is acquired, the metrology data (i.e., pre-process and/or post-process metrology data) is stored by the system 300 (block 680). In one embodiment, the pre-process and/or post-process metrology data acquired by the integrated metrology tool 310 is stored in the integrated metrology data storage unit 330, and the pre-process and post-process metrology data acquired by the offline metrology tool 450 is stored in the offline metrology data storage unit 480. The computer system 430 can then access the metrology data and perform analysis (e.g., comparison of the pre-process and post-process metrology data to evaluate the accuracy of the process operations performed on the semiconductor wafer 105) of processes performed by the processing tools 410 (block 690).

Results from the analysis of the metrology data may be used to modify one or more control input parameters that control the operations of the processing tools 410, such as feedback and/or feed-forward adjustments (block 695). In one embodiment, to perform a feed-forward adjustment, an error on a processed semiconductor wafer 105 based upon a completed process is identified. A compensation factor for reducing an effect of the identified error is then calculated. At least one control input parameter relating to a subsequent process based upon the compensation factor is modified. The process comprised of the modified control input parameter, is then performed on a subsequently processed semiconductor wafer 105. In one embodiment, calculating the compensation factor for reducing the effect of the identified error comprises calculating a modified etch time for an etch process, a modified chemical mechanical polishing (CMP) time period for a CMP process, and a modified exposure dosage for a photolithography process. However, these examples are provided by way of illustrations only, and the present invention should not be considered as limited to such examples unless they are specifically set forth in the appended claims.

Figure 7:
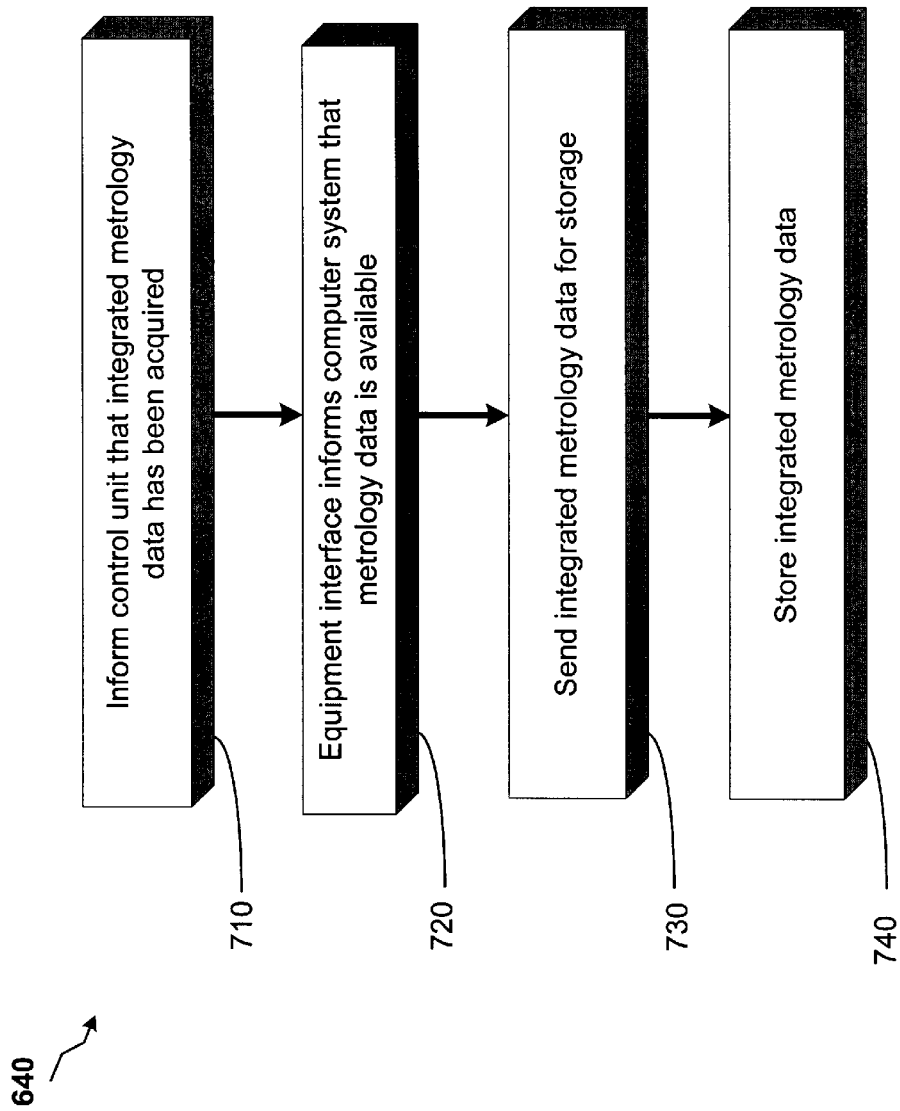
FIG. 7 illustrates a flowchart depiction of a method of performing inline metrology data transfer and status update, as indicated in FIG. 6, in accordance with illustrative one embodiment of the present invention.

FIG. 7 is a flowchart representation of the method for performing an integrated metrology data transfer and status update, as described in block 640 of FIG. 6. As shown herein, once the system 300 acquires integrated metrology data, the system 300 informs the tool control unit 530 that integrated metrology data has been acquired (block 710). The tool control unit 530 then communicates with the equipment interface 510, which informs the computer system 430 that integrated metrology data is available (block 720), so that the computer system 430 can execute an efficient reaction to the integrated metrology data.

In one embodiment, communication with the computer system 430 is performed via the machine interface 415. The system 300 then sends the integrated metrology data for storage from the processing tool 410 (block 730). In one embodiment, the integrated metrology data is sent via the equipment interface 510 and the machine interface 415 onto the computer system 430. In one embodiment, the computer system 430 stores the integrated metrology data into the integrated metrology data storage unit 330 for later retrieval (block 740). The tool control unit 530 also sends a status to the computer system 430 indicating that a particular integrated metrology data is available. Completion of the steps described in FIG. 7 essentially completes the process of performing integrated metrology data transfer and status update as indicated in block 640 in FIG. 6.

Turning now to FIG. 8, a flowchart depiction of one illustrative embodiment of a method for acquiring post-process integrated metrology data, as indicated in block 670 of FIG. 6 is illustrated. After the system 300 processes a semiconductor wafer 105, a signal is received by the system 300 indicating that at least one semiconductor wafer 105 has been processed (block 810). In one embodiment, the equipment interface 510 sends a signal to the computer system 430 indicating the status of a process completion. When the system 300 learns that a semiconductor wafer 105 has been processed, it makes a determination as to which semiconductor wafer 105 in the tool has been processed and is next in queue for metrology analysis (block 820). Generally, the order of metrology analysis performed on the semiconductor wafers 105 follows the order of processing within the processing tool 410. Once the system 300 determines and targets a particular semiconductor wafer 105 for integrated metrology data acquisition, the system 300 acquires that particular wafer 105 for integrated metrology data acquisition (block 830).

The system 300 then acquires post-process integrated metrology data from the targeted semiconductor wafer 105 (block 840). In one embodiment, while metrology data is being acquired by the integrated metrology tool 310, another wafer 105 may be processed in the process chamber 520 approximately simultaneously. The integrated metrology tool 310 within the processing tool 410 acquires the metrology data. In one embodiment, integrated post-process metrology data is acquired immediately after the processing of a particular semiconductor wafer 105. Therefore, real time or near real time metrology data is provided to the system 300. The completion of the steps illustrated in FIG. 8 substantially completes the process of acquiring post-process integrated metrology data, as indicated in block 670 of FIG. 6.

The principles taught by the present invention can be implemented in an Advanced Process Control (APC) Framework, such as a Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI. The APC is a preferred platform from which to implement the control strategy taught by the present invention. In some embodiments, the APC can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:

providing a lot of semiconductor wafers;

performing a pre-process integrated metrology data acquisition relating to a first semiconductor wafer within said lot of semiconductor wafers, said pre-process integrated metrology data comprising data acquired using a metrology tool integrated into a processing tool used to process said semiconductor wafers;

performing a first process operation on said first semiconductor wafer at least partially during the process of acquiring pre-process metrology data from a second semiconductor wafer within said lot of semiconductor wafers;

acquiring post-process integrated metrology data relating to said first semiconductor wafer in response to processing of said first semiconductor wafer, said post-process integrated metrology data comprising data acquired using said metrology tool integrated into said processing tool used to process said semiconductor wafers; and analyzing said pre-process and said post-process metrology data for evaluation of said process operation performed on said first semiconductor wafer.

2. The method described in claim 1, further comprising performing a feed-forward adjustment for a subsequent process operation performed on said first semiconductor wafer based upon said evaluation.

3. The method described in claim 2, wherein performing said feed-forward adjustment process further comprises:

identifying an error on said first semiconductor wafer based upon said first process operation;

calculating a compensation factor for reducing an effect of said identified error;

modifying at least one control input parameter relating to a subsequent process operation to be performed on said semiconductor wafer based upon said compensation factor; and performing said subsequent process operation on said semiconductor wafer based upon said modified control input parameter.

4. The method described in claim 3, wherein calculating said compensation factor for reducing an effect of said identified error further comprises calculating at least one of a modified etch time, a modified chemical mechanical polishing time, and a modified exposure dosage.

5. The method described in claim 1, further comprising performing a feedback adjustment for said process operation to be performed on said second semiconductor wafer based upon said evaluation.

6. The method described in claim 1, wherein acquiring pre-process and post-process integrated metrology data from said first semiconductor wafer comprises acquiring metrology data using said integrated metrology tool.

7. The method described in claim 1, wherein acquiring post-process integrated metrology data from said first semiconductor wafer further comprises:

receiving notification of completion of said processing of said first semiconductor wafer;

identifying said first semiconductor wafer for metrology analysis; and acquiring integrated metrology data of said identified semiconductor wafer using said integrated metrology tool.

8. The method described in claim 1, wherein providing said pre-process and said post-process metrology data for evaluation of said process operation performed on said first semiconductor wafer further comprises storing said pre-process and said post-process integrated metrology data in a memory associated with a computer system.

9. The method described in claim 8, wherein providing said pre-process and said post-process metrology data for evaluation of said process operation performed on said first semiconductor wafer further comprises comparing said pre-process operation integrated metrology data with said post-processing integrated metrology data for determining the accuracy of said process operation.

10. A method, comprising:

providing a lot of semiconductor wafers;

determining if pre-process metrology data is to be acquired for a first semiconductor wafer within said lot of semiconductor wafers;

performing a pre-process integrated metrology data acquisition relating to said first semiconductor wafer;

performing a first process operation on said first semiconductor wafer at least partially during the process of acquiring pre-process metrology data from a second semiconductor wafer within said lot of semiconductor wafers;

acquiring post-process integrated metrology data relating to said first semiconductor wafer in response to processing of said first semiconductor wafer, said post-process integrated metrology data comprising data acquired using a metrology tool integrated into a processing tool used to process said semiconductor wafers;

analyzing said pre-process and post-process metrology data for evaluation of said process operation performed on said first semiconductor wafer;

performing a feed-forward adjustment for a subsequent process operation performed on said first semiconductor wafer based upon said evaluation; and performing a feedback adjustment for a subsequent process operation performed on said second semiconductor wafer based upon said evaluation.

11. The method described in claim 10, wherein determining if pre-process metrology data is to be acquired for a first semiconductor wafer further comprises determining that a pre-polish metrology data is to be acquired for a chemical-mechanical polishing process.

12. The method described in claim 10, wherein performing said feed-forward adjustment process further comprises:

identifying an error on said first semiconductor wafer based upon said first process operation;

calculating a compensation factor for reducing an effect of said identified error;

modifying at least one control input parameter relating to a subsequent process operation to be performed on said first semiconductor wafer based upon said compensation factor; and performing said subsequent process operating on said first semiconductor wafer based upon said modified control input parameter.

13. The method described in claim 12, wherein calculating said compensation factor for reducing an effect of said identified error further comprises calculating at least one of a modified etch time, a modified chemical mechanical polishing time, and a modified exposure dosage.

14. The method described in claim 10, wherein providing said pre-process and said post-process metrology data for evaluation of said first process operation performed on said first semiconductor wafer further comprises comparing said pre-process operation integrated metrology data with said post-processing integrated metrology data for determining the accuracy of said first process operation.

15. A system, comprising:

a process controller to perform an integrated metrology data acquisition operation comprising:

performing a pre-process integrated metrology data acquisition relating to a first semiconductor wafer within a lot of semiconductor wafers;

performing a first process operation on said first semiconductor wafer at least partially during the process of acquiring pre-process metrology data from a second semiconductor wafer within said lot of semiconductor wafers;

acquiring post-process integrated metrology data relating to said first semiconductor wafer in response to processing of said first semiconductor wafer;

analyzing said pre-process and said post-process metrology data for evaluation on said process operation performed on said first semiconductor wafer;

performing a feed-forward adjustment for a subsequent process operation performed on said first semiconductor wafer based upon said evaluation;

performing a feedback adjustment for a subsequent process operation performed on said second semiconductor wafer based upon said evaluation;

an integrated metrology data storage unit operatively coupled to said process controller, said integrated metrology data storage unit to receive and store said pre-process and post-process integrated metrology data; and a processing tool operatively coupled to said process controller, said processing tool to perform said first process operation and acquire said pre-process and post-process integrated metrology data, said processing toll comprising;

a process chamber for performing said first process operation; and and integrated metrology tool for acquiring said pre-process and post-process integrated metrology data, said integrated metrology tool being integrated within said processing tool.

16. The system of claim 15, further comprising:

a computer system operatively coupled with said feed-forward unit, said computer system to perform at least one calculation of a compensation factor for performing said feed-forward operation;

a manufacturing model operatively coupled with said computer system, said manufacturing model to generate and modify at least one control input parameter signal; and a machine interface operatively coupled with said manufacturing model, said machine interface being capable of receiving process recipes from said manufacturing model and providing at least one control input parameter signal to said processing tool.

17. The system of claim 16, wherein said computer system is capable of generating modification data for modifying at least one parameter in said manufacturing model in response to at least one of said feed-forward adjustment and said feedback adjustment.

18. The system of claim 16, wherein said integrated metrology tool is located within said processing tool.

19. An apparatus, comprising:

means for providing a lot of semiconductor wafers;

means for performing a pre-process integrated metrology data acquisition relating to a first semiconductor wafer within said lot of semiconductor wafers, said pre-process integrated metrology data comprising data acquired using a metrology tool integrated into a processing tool used to process said semiconductor wafers;

means for performing a first process operation on said first semiconductor wafer at least partially during the process of acquiring pre-process metrology data from a second semiconductor wafer within said lot of semiconductor wafers;

means for acquiring post-process integrated metrology data relating to said first semiconductor wafer in response to processing of said first semiconductor wafer, said post-process integrated metrology data comprising data acquired using said metrology tool integrated into said processing tool used to process said semiconductor wafers; and means for analyzing said pre-process and said post-process and said post-process metrology data for evaluation of said process operation performed on said first semiconductor wafer.

20. A computer readable program storage device encoded with instructions that, when executed by a computer, performs a method, comprising:

providing a lot of semiconductor wafers;

performing a pre-process integrated metrology data acquisition relating to a first semiconductor wafer within said lot of semiconductor wafers, said pre-process integrated metrology data comprising data acquired using a metrology tool integrated into a processing tool used to process said semiconductor wafers;

performing a first process operation on said first semiconductor wafer at least partially during the process of acquiring pre-process metrology data from a second semiconductor wafer within said lot of semiconductor wafers;

acquiring post-process integrated metrology data first semiconductor wafer in response to processing of said first semiconductor wafer, said post-process integrated metrology data comprising data acquired using said metrology tool integrated into said processing tool uses to process said semiconductor wafers; and analyzing said pre-process and said post-process metrology data for evaluation of said process operation performed on said first semiconductor wafer.

21. The computer readable program storage device encoded with instructions that, when executed by a computer, performs the method described in claim 20, further comprising performing a feed-forward adjustment for a subsequent process operation performed on said first semiconductor wafer based upon said evaluation.

22. The computer readable program storage device encoded with instructions that, when executed by a computer, performs the method described in claim 21, wherein performing said feed-forward adjustment process further comprises:

identifying an error on said first semiconductor wafer based upon said first process operation;

calculating a compensation factor for reducing an effect of said identified error;

modifying at least one control input parameter relating to a subsequent process operation to be performed on said semiconductor wafer based upon said compensation factor; and performing said subsequent process operation on said semiconductor wafer based upon said modified control input parameter.

23. The computer readable program storage device encoded with instructions that, when executed by a computer, performs the method described in claim 22, wherein calculating said compensation factor for reducing an effect of said identified error further comprises calculating at least one of a modified etch time, a modified chemical mechanical polishing time, and a modified exposure dosage.

24. The computer readable program storage device encoded with instructions that, when executed by a computer, performs the method described in claim 20, further comprising further comprising performing a feedback adjustment for said process operation to be performed on said second semiconductor wafer based upon said evaluation.

25. The computer readable program storage device encoded with instructions that, when executed by a computer, performs the method described in claim 20, wherein acquiring pre-process and post-process integrated metrology data from said first semiconductor wafer comprises acquiring metrology data using an integrated metrology tool.

26. The computer readable program storage device encoded with instructions that, when executed by a computer, performs the method described in claim 20, wherein acquiring post-process integrated metrology data further comprises:

receiving notification of completion of said processing of said first semiconductor wafer;

identifying said first semiconductor wafer for metrology analysis; and acquiring integrated metrology data of said identified semiconductor wafer using said integrated metrology tool.

27. The computer readable program storage device encoded with instructions that, when executed by a computer, performs the method described in claim 20, wherein providing said pre-process and said post-process metrology data for evaluation of said process operation performed on said first semiconductor wafer further comprises storing said pre-process and said post-process integrated metrology data in a memory associated with a computer system.

28. The computer readable program storage device encoded with instructions that, when executed by a computer, performs the method described in claim 27, wherein providing said pre-process and said post-process metrology data for evaluation of said process operation performed on said first semiconductor wafer further comprises comparing said pre-process operation integrated metrology data with said post-processing integrated metrology data for determining the accuracy of said process operation.

29. An apparatus, comprising:

a controller for acquiring pre-process integrated metrology data acquisition relating to a first semiconductor wafer within a lot of semiconductor wafers said integrated metrology data being acquired by a metrology tool integrated within a processing tool, and performing a first process operation on said first semiconductor wafer at least partially during the process of acquiring said pre-processing integrated metrology data form a second semiconductor wafer within said lot of semiconductor wafers, said controller to also acquire post-process integrated metrology data relating to said first semiconductor wafer in response to performing said first process operation upon said first semiconductor wafer; and to analyze said pre-process and said post-process metrology data for evaluation of a process operation performed on said first semiconductor wafer.

30. The apparatus of claim 29, wherein said controller is integrated into a computer system that is operatively coupled to a processing tool, such that said controller is capable of controlling and operation of said processing tool.

31. The apparatus of claim 30, wherein said controller is capable of performing a feed-forward adjustment process for a subsequent process operation performed on said first semiconductor wafer, said feed-forward adjustment process comprising:

identifying an error on said semiconductor wafer based upon said process operation;

calculating a compensation factor for reducing an effect of said identified error;

modifying at least one control input parameter relating to a subsequent process operation to be performed on said semiconductor wafer based upon said compensation factor; and performing said subsequent process operation on said semiconductor wafer based upon said modified control input parameter.

32. A method, comprising:

initializing processing of a lot of semiconductor wafers;

acquiring pre-process metrology data using a metrology tool integrated into a processing tool used to process said semiconductor wafers performing a process operation on said first semiconductor wafer at least partially during the process of acquiring pre-process metrology data from a second semiconductor wafer within said lot of semiconductor wafers;

acquiring post-process metrology data relating to said first semiconductor wafer in response to processing of said first semiconductor wafer, said post-process integrated metrology data comprising data acquired using a metrology tool integrated into a processing tool used to process said semiconductor wafers;

performing an analysis based upon said pre-process and said post-process metrology data for evaluation of said process operation performed on said first semiconductor wafer; and processing at least of said second wafer and a third wafer based upon said analysis.

33. The method described in claim 32, further comprising performing a feed-forward adjustment for a subsequent process operation performed on said first semiconductor wafer based upon said evaluation.

34. The method described in claim 33, wherein performing said feed-forward adjustment process further comprises:

identifying an error on said semiconductor wafer based upon said process operation;

calculating a compensation factor for reducing an effect of said identified error;

modifying at least one control input parameter relating to a subsequent process operation to be performed on said semiconductor wafer based upon said compensation factor; and performing said subsequent process operation on said semiconductor wafer based upon said modified control input parameter.

\* \* \* \* \*

UNITED STATES PATENT AND TRADEMARK OFFICE
CERTIFICATE OF CORRECTION

PATENT NO. : 6,788,988 B1
DATED : September 7, 2004
INVENTOR(S) : Alexander J. Pasadyn and Christopher A. Bode It is certified that error appears in the above-identified patent and that said Letters Patent is hereby corrected as shown below:

Column 5,
Line 54, replace "near real-time time" with -- near real-time --.

Column 7,
Line 48, replace "process" with -- processing --.

Column 13,
Line 35, replace "operating" with -- operation --.
Line 66, replace "evaluation on" with -- evaluation of --.

Column 14,
Line 16, replace "toll" with -- tool --.
Line 20, replace "and integrated" with -- an integrated --.

Column 15,
Line 18, after "acquiring post-process integrated metrology data" insert -- relating to said --
Line 22, replace "uses" with -- used --.

Column 16,
Line 42, replace "pre-processing" with -- pre-process --.
Line 42, replace "form" with -- from --.

Column 17,
Line 8, insert a -- ; -- after the word "wafers".

UNITED STATES PATENT AND TRADEMARK OFFICE
CERTIFICATE OF CORRECTION

PATENT NO. : 6,788,988 B1
DATED : September 7, 2004
INVENTOR(S) : Alexander J. Pasadyn and Christopher A. Bode It is certified that error appears in the above-identified patent and that said Letters Patent is hereby corrected as shown below:

Column 18,
Line 1, replace "at least of said second wafer" with -- at least one of said second wafer --.

Signed and Sealed this

Fifteenth Day of February, 2005

JON W. DUDAS
*Director of the United States Patent and Trademark Office*